US012734963B2

(12) United States Patent
Steel

(10) Patent No.: US 12,734,963 B2
(45) Date of Patent: Sep. 15, 2026

(54) STATIONARY CAMERA IN AN INTERIOR REARVIEW MIRROR

(71) Applicant: GENTEX CORPORATION, Zeeland, MI (US)

(72) Inventor: Robert Steel, Coventry (GB)

(73) Assignee: GENTEX CORPORATION, Zeeland, MI (US)

(*) Notice: Subject to any disclaimer, the term of this patent is extended or adjusted under 35 U.S.C. 154(b) by 543 days.

(21) Appl. No.: 18/197,778

(22) Filed: May 16, 2023

(65) Prior Publication Data

US 2023/0365061 A1 Nov. 16, 2023

Related U.S. Application Data

(60) Provisional application No. 63/342,216, filed on May 16, 2022.

(51) Int. Cl.
*B60R 1/08* (2006.01)
*B60R 1/12* (2006.01)
*H05K 1/02* (2006.01)

(52) U.S. Cl.
CPC .................. *B60R 1/08* (2013.01); *B60R 1/12* (2013.01); *H05K 1/0274* (2013.01); *B60R 2001/1253* (2013.01)

(58) Field of Classification Search
CPC .... B60R 1/04; B60R 1/06; B60R 1/08; B60R 1/12; B60R 2001/1253; H05K 1/0274
USPC ................................ 359/265, 267, 838, 839
See application file for complete search history.

(56) References Cited

U.S. PATENT DOCUMENTS

| | | | |
|---|---|---|---|
| 5,928,572 | A | 7/1999 | Tonar et al. |
| 5,998,617 | A | 12/1999 | Srinivasa et al. |
| 6,020,987 | A | 2/2000 | Baumann et al. |
| 6,037,471 | A | 3/2000 | Srinivasa et al. |
| 6,137,620 | A | 10/2000 | Guarr et al. |
| 6,141,137 | A | 10/2000 | Byker et al. |
| 6,193,912 | B1 | 2/2001 | Thieste et al. |
| 6,241,916 | B1 | 6/2001 | Claussen et al. |
| 6,249,369 | B1 | 6/2001 | Theiste et al. |

(Continued)

FOREIGN PATENT DOCUMENTS

| | | | |
|---|---|---|---|
| CN | 212413264 | U | 1/2021 |
| DE | 102019208231 | A1 | 12/2020 |

(Continued)

OTHER PUBLICATIONS

U.S. Appl. No. 61/707,625, filed Sep. 28, 2012, entitled Integrated Spotter in Interior Electrochromic Mirror.

*Primary Examiner* — Stephone B Allen
(74) *Attorney, Agent, or Firm* — Price Heneveld LLP; Brian James Brewer

(57) ABSTRACT

A mirror assembly for a vehicle includes a glass element that is at least partially reflective and a housing that is coupled to the glass element. A mounting member includes an internal portion located within the housing that defines a mounting member connector. The housing includes a housing connector operably coupled to the mounting member connector and configured to articulate the housing relative to the mounting member between different positions. A camera unit is connected to the internal portion of the mounting member such that it remains stationary as the housing is articulated relative to the mounting member.

20 Claims, 6 Drawing Sheets

(56) References Cited

U.S. PATENT DOCUMENTS 6,519,072 B2 2/2003 Nishikitani et al.
6,520,667 B1 * 2/2003 Mousseau ................. B60R 1/12 359/603
6,870,655 B1 * 3/2005 Northman ......... B60R 21/01566 359/603
6,961,195 B2 * 11/2005 Inagaki ..................... B60R 1/12 359/872
7,249,860 B2 * 7/2007 Kulas ........................ B60R 1/04 359/872
7,338,177 B2 * 3/2008 Lynam ...................... B60R 1/12 359/872
8,201,800 B2 6/2012 Filipiak
8,210,695 B2 7/2012 Roth et al.
8,264,761 B2 9/2012 Cammenga et al.
8,643,931 B2 2/2014 Cammenga et al.
8,646,924 B2 2/2014 Roth et al.
8,814,373 B2 8/2014 Steel et al.
8,827,517 B2 9/2014 Cammenga et al.
8,885,240 B2 11/2014 Roth et al.
8,925,891 B2 1/2015 Van Huis et al.
8,960,629 B2 2/2015 Rizk et al.
9,150,156 B2 * 10/2015 Bowers ................. B60R 1/0607
9,174,577 B2 11/2015 Busscher et al.
9,244,249 B2 1/2016 Kim et al.
9,316,347 B2 4/2016 Roth
9,479,758 B2 * 10/2016 Woo ..................... H04N 13/254
9,505,349 B2 * 11/2016 Fish, Jr. ............. G02B 27/0149
9,838,653 B2 12/2017 Fish, Jr. et al.
10,640,046 B1 * 5/2020 Englander ................. B60R 1/04
10,739,591 B2 8/2020 Lee et al.
12,330,560 B2 * 6/2025 Anderson ........... F21V 23/0478
2010/0201896 A1 * 8/2010 Ostreko .................... B60R 1/12 349/1
2011/0084198 A1 * 4/2011 McCabe ............. G02B 5/0858 204/192.1
2018/0312113 A1 11/2018 Hirano et al.
2018/0370437 A1 12/2018 Kong et al.
2022/0258667 A1 * 8/2022 De Wind .................. B60R 1/04

FOREIGN PATENT DOCUMENTS

JP H11331653 A 11/1999
JP 2007022495 A 2/2007
JP 2018172112 A 11/2018
WO 9842796 A1 10/1998
WO 9902621 A1 1/1999
WO 2016187215 A1 11/2016
WO 2018167096 A1 9/2018

* cited by examiner

STATIONARY CAMERA IN AN INTERIOR REARVIEW MIRROR

CROSS-REFERENCE TO RELATED APPLICATION

This application claims priority to and the benefit under 35 U.S.C. § 119 (e) of U.S. Provisional Application No. 63/342,216, filed on May 16, 2022, entitled "STATIONARY CAMERA IN AN INTERIOR REARVIEW MIRROR," the disclosure of which is hereby incorporated herein by reference in its entirety.

FIELD OF THE DISCLOSURE

The present disclosure generally relates to a rearview device system and, more particularly, a mirror assembly having a camera that remains stationary.

SUMMARY OF THE DISCLOSURE

According to one aspect of the present disclosure, a mirror assembly for a vehicle includes a glass element that is at least partially reflective and a housing that is coupled to the glass element. A mounting member includes an internal portion located within the housing that defines a mounting member connector. The housing includes a housing connector operably coupled to the mounting member connector and configured to articulate the housing relative to the mounting member between different positions. A camera unit is connected to the internal portion of the mounting member such that it remains stationary as the housing is articulated relative to the mounting member.

According to another aspect of the present disclosure, a mirror assembly for a vehicle includes a glass element that is at least partially reflective and a housing that is coupled to the glass element. A mounting member includes an internal portion located within the housing that defines a mounting member connector. The housing includes a housing connector operably coupled to the mounting member connector and configured to articulate the housing relative to the mounting member between different positions along at least two axes. A camera unit is connected to the internal portion of the mounting member such that it remains stationary as the housing is articulated relative to the mounting member. A printed circuit board ("PCB") is located in the housing and is statically coupled to one of the mounting members and the housing.

According to yet another aspect of the present disclosure, a mirror assembly for a vehicle includes a glass element that is at least partially reflective and a housing that is coupled to the glass element. A mounting member includes an internal portion located within the housing that defines a mounting member connector. The housing includes a housing connector operably coupled to the mounting member connector and configured to articulate the housing relative to the mounting member between different positions along at least two axes. A camera unit is connected to the internal portion of the mounting member such that it remains stationary as the housing is articulated relative to the mounting member. A printed circuit board ("PCB") is located in the housing and is statically coupled to one of the mounting member and the housing. The PCB defines an aperture aligned with the camera unit.

These and other features, advantages, and objects of the present disclosure will be further understood and appreciated by those skilled in the art by reference to the following specification, claims, and appended drawings.

DETAILED DESCRIPTION

Figure 1:
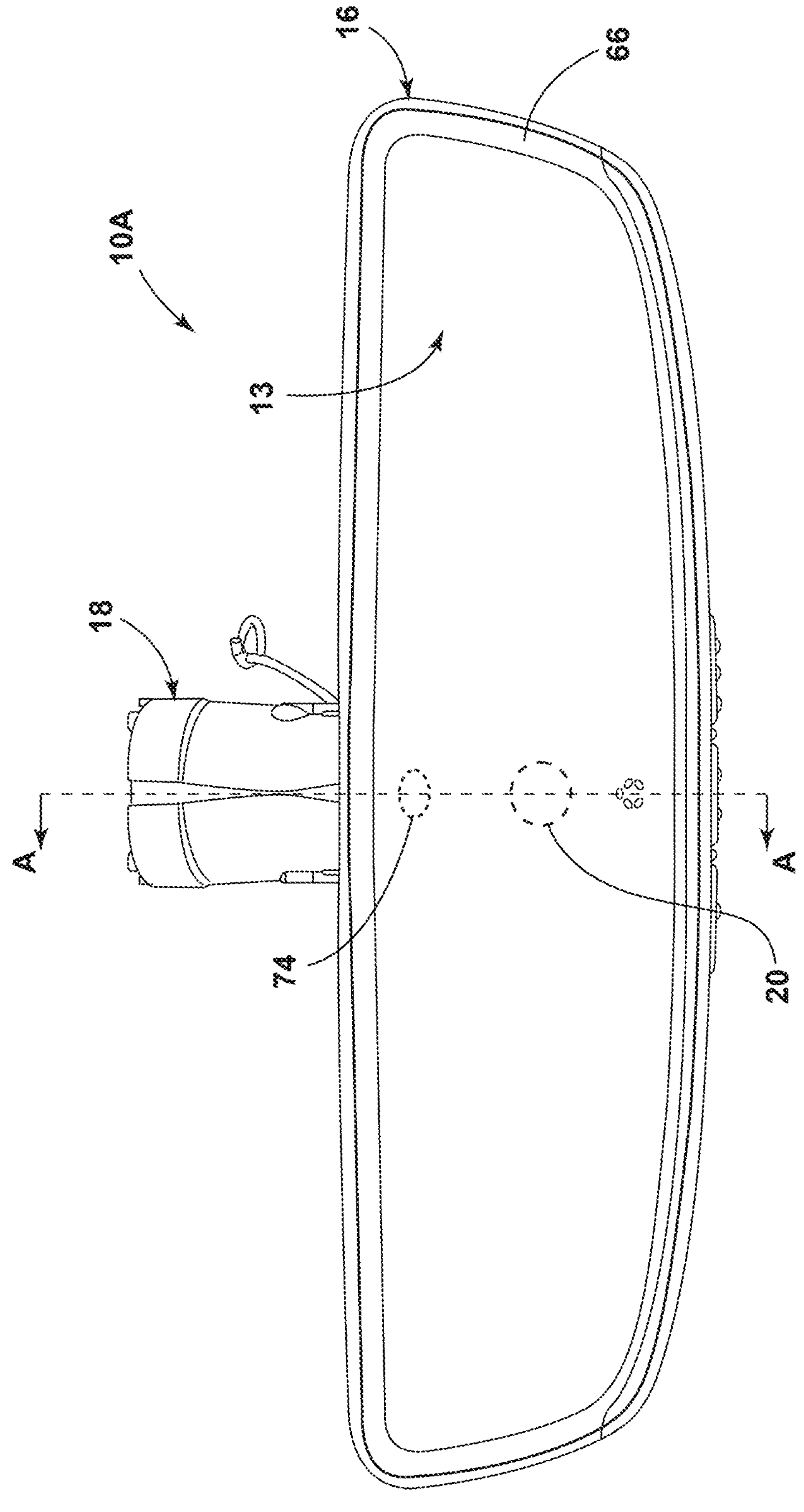
FIG. 1 is a front elevational view of a mirror assembly, according to the present disclosure.

The present illustrated embodiments reside primarily in combinations of method steps and apparatus components related to a mirror assembly having a camera that remains stationary. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof, shall relate to the disclosure as oriented in FIG. 1. Unless stated otherwise, the term "front" shall refer to the surface of the device closer to an intended viewer of the device, and the term "rear" shall refer to the surface of the device further from the intended viewer of the device. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring now to FIG. 1, reference numeral 10A generally designates a mirror assembly for a vehicle of a first construction. In some embodiments, the mirror assembly 10A may be configured as a full display mirror and include a reflective state and a display state. In the reflective state, the mirror assembly 10A operates as a mirror, reflecting light at various wavelengths back towards an intended viewer. In the display state, the mirror assembly 10A relays information to a vehicle operator (e.g., a message or recommendation associated with the image data) captured from one or more image capturing components. In other embodiments, the mirror assembly 10A may be configured as a traditional rearview mirror with a constant reflective state. The mirror assembly 10A includes a glass element 12 that defines a viewing area 13, which may be constantly reflective (e.g., as a traditional rearview mirror) or as a partially reflective, partially transmissive element (e.g., as a full display mirror). The mirror assembly 10A may include a display module 14 (FIGS. 2-4, and 6) that is viewed through glass element 12 (e.g., in the full display mirror configuration). The display module 14 provides image data information through the glass element 12. The mirror assembly 10A further includes a housing 16 that shields and supports the glass element 12 and the display module 14. The housing 16 attaches to an associated vehicle via a mounting member 18. The housing 16 is moveable relative to the mounting member 18 to orient the glass element 12 at various angles relative to a vehicle operator to obtain different environmental views and/or orientations relative to the vehicle operator. The mirror assembly 10A includes a camera unit 20 for capturing image data. As will be appreciated, the camera unit 20 may be stationary relative to movement of the glass element 12, the display module 14, and/or the housing 16. More particularly, the camera unit 20 may be directly coupled to a portion of the mounting member 18 located within the housing 16. The display module 14 may be sized to substantially extend across the entire viewing area 13 (FIGS. 2-4) or at one or more discrete locations within the viewing area 13 (not shown). As such, in embodiments wherein the display module 14 does not substantially extend across an entire viewing area 13 (i.e., the display module 14 is located at one or more discrete locations within the viewing area 13), the camera unit 20 may not be aligned with the display module 14 but may still be aligned with the partially transmissive element 12.

Figure 2:
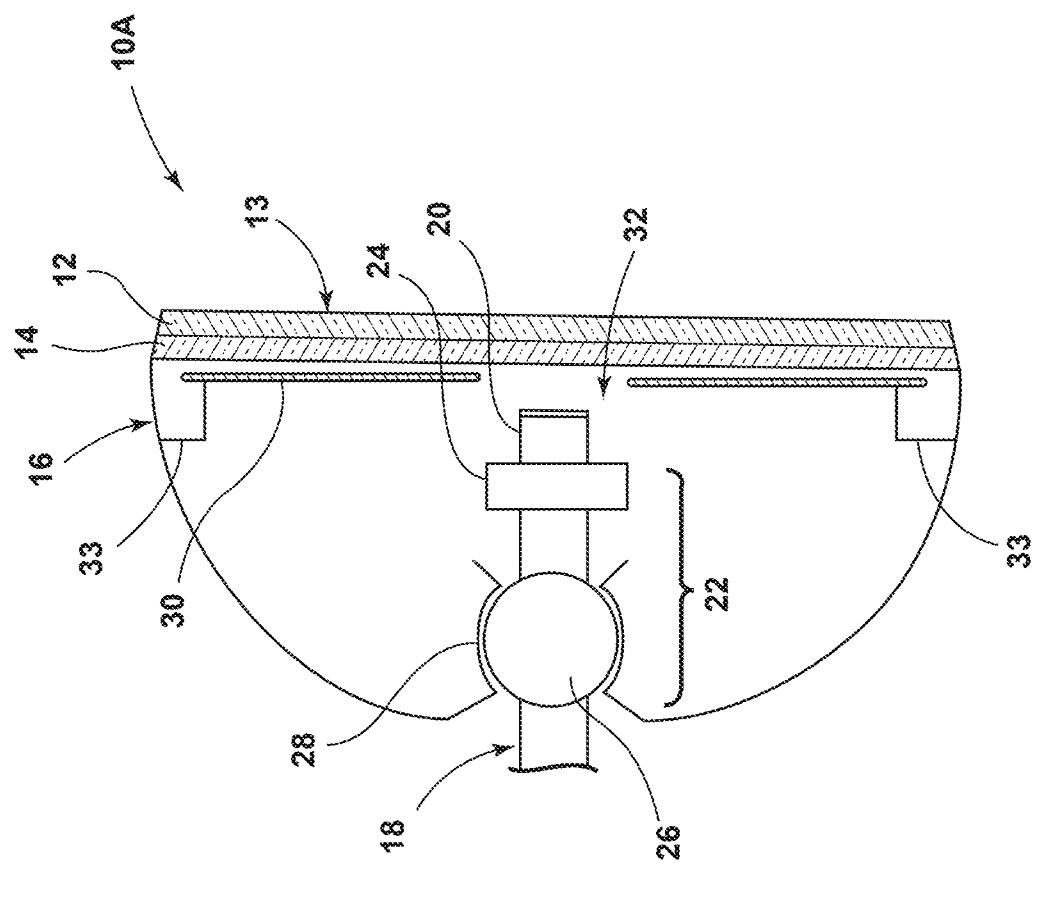
FIG. 2 is a cross-sectional view of a mirror assembly of a first construction, according to the present disclosure.

Referring to FIG. 2, a cross-sectional view of the mirror assembly 10A of the first construction is illustrated along the dashed line A-A in FIG. 1. The mounting member 18 includes an internal portion 22 located within the housing 16 that extends to a camera mount 24 that is coupled to the camera unit 20. The mounting member 18 includes a mounting member connector 26, and the housing 16 includes a housing connector 28 that can be articulated relative to the mounting member connector 26. The camera mount 24 is located between the mounting member connector 26 and the glass element 12. In this manner, as the housing 16 is articulated into various positions (FIG. 5), the camera unit 20 remains stationary on the mounting member 18. Accordingly, the camera unit 20 can be oriented to positions within a cabin of the associated vehicle and remain static in the selected orientation regardless of the movement of the housing 16. In some embodiments, one of the mounting member connector 26 and the housing connector 28 includes a ball and the other of the mounting member connector 26 and the housing connector 28 includes a basket that grasps the ball and permits relative articulation therebetween along at least two axes. More particularly, the relative articulation between the mounting member connector 26 and the housing connector 28 may change the pitch (i.e., up-and-down), yaw (i.e., side-to-side), and/or roll (i.e., rotational).

With continued reference to FIG. 2, the housing connector 28 includes the basket and the mounting member connector 26 includes the ball. As will be described in greater detail below, the mirror assembly 10A includes a PCB 30 that may be connected between the camera unit 20 and the glass element 12. The PCB 30 may define an aperture 32 for permitting the camera unit 20 to capture image data through the aperture 32. One or more fastening members 33 may connect the PCB 30 to the housing 16, the glass element 12, and/or the display module 14. In some embodiments, the internal portion 22 of the mounting member 18 may extend through the aperture 32 and the PCB 30 may be located between the camera unit 20 and the mounting member connector 26.

Figure 3:
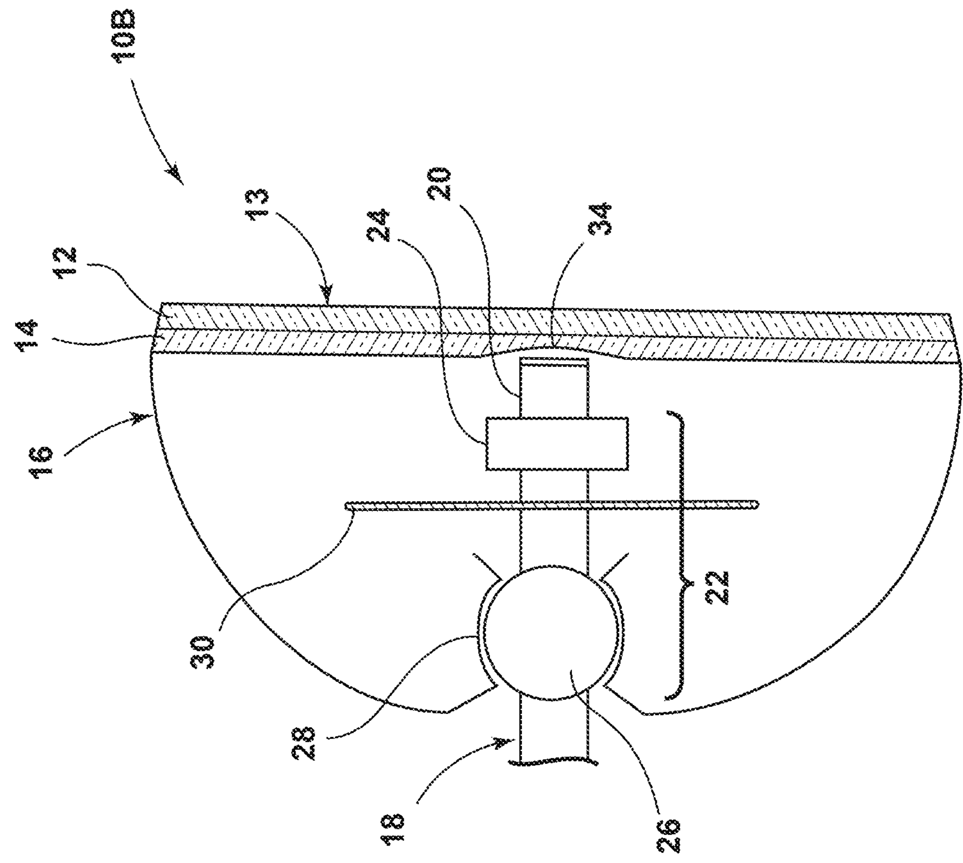
FIG. 3 is a cross-sectional view of a mirror assembly of a second construction, according to the present disclosure.

With reference now to FIG. 3, a mirror assembly 10B of a second construction is illustrated. Unless otherwise indicated, the mirror assembly 10B of the second construction may share all of the same features, functions, materials, and structures of the mirror assembly 10A of the first construction. However, in the second construction, the PCB 30 may be directly connected to the internal portion 22 of the mounting member 18. More particularly, the PCB 30 may be directly connected to the internal portion 22 between the mounting member connector 26 and the camera mount 24. The glass element 12 and/or the display module 14 may include a concave surface 34, and the camera unit 20 may be at least partially located in a space defined by the concave surface 34. Generally speaking, the closer the camera unit 20 is to the viewing area 13 of the glass element 12, the clearer the image will be that is captured by the camera unit 20. In some embodiments, the concave surface 34 has a parabolic or spherical shape. The concave surface 34 may be grinded and may be finished with a chrome layer.

Figure 4:
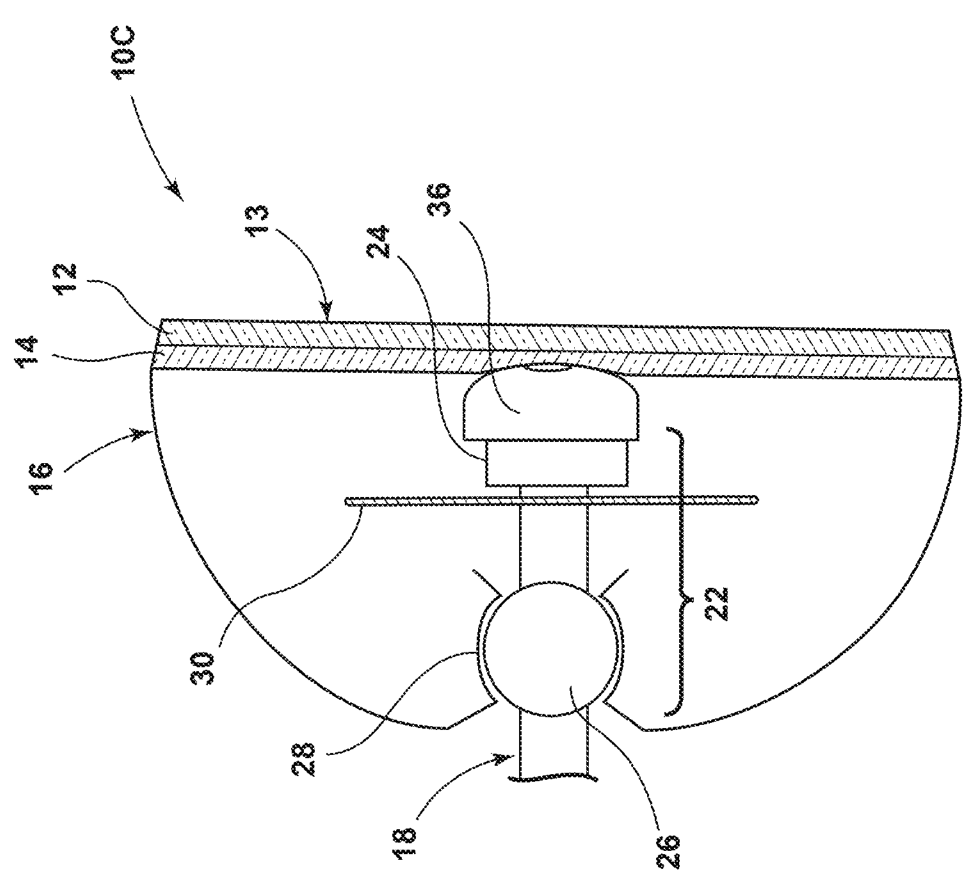
FIG. 4 is a cross-sectional view of a mirror assembly of a third construction, according to the present disclosure.

With reference now to FIG. 4, a mirror assembly 10C of a third construction is illustrated. Unless otherwise indicated, the mirror assembly 10C of the third construction may share all the same features, functions, materials, and structures of the mirror assemblies 10A, 10B of the first and second constructions. However, in the third construction, a sleeve 36 may extend around the camera unit 20 and extend from the camera unit 20 to the glass element 12 and/or the display module 14. The sleeve 36 may be flexible and substantially opaque. For example, the sleeve 36 may be formed of an elastic polymer and may further include one or more gussets to facilitate elastic deformation. In use, the sleeve 36 reduces ambient light entering the housing 16, light from the display module 14, and/or other components of the mirror assembly 10C from negatively interfering with images captured by the camera unit 20. The sleeve 36 may connect to the glass element 12 and/or the display module 14 via an adhesive, or the like. Thus, as the housing 16 is articulated, the sleeve 36 conforms to the angle of articulation. It should be appreciated that the sleeve 36 may be implemented in any of the other constructions to reduce ambient lighting and/or lighting from other components of the mirror assembly 10A-10C (e.g., the display module 14).

Figure 5:
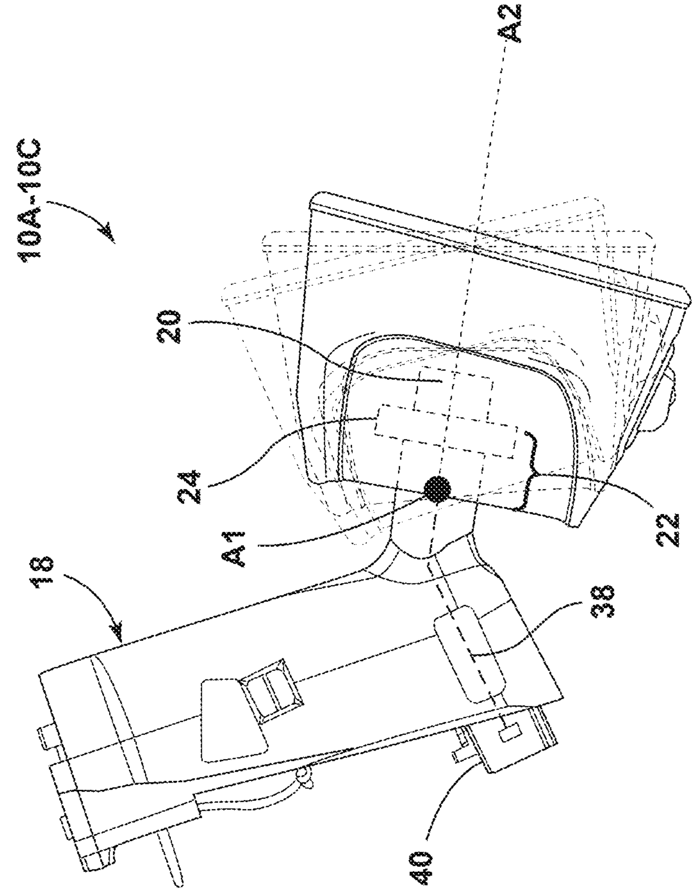
FIG. 5 is a side elevational view of the full display mirror articulated between various positions, according to the present disclosure.

With reference now to FIG. 5, a side view of the mirror assembly 10A-10C is illustrated in a variety of articulated positions. As previously described, the housing 16 may be articulated along at least two axes (e.g., pitch, yaw, and/or roll). The housing 16 may be articulated relative to the pitch (i.e., about a first axis A1), for example, at least 10° in total, for example, up at least 5° and down at least 5° from a neutral position. In other embodiments, the housing 16 may be articulated at least 15° in total, at least 20° in total, or at least 30° in total with a substantially equal split between the up direction and the down direction. The housing 16 may be articulated relative to the yaw (i.e., about a second axis A2), for example, at least 10° in total, for example, up at least 5° and down at least 5° from a neutral position. In other embodiments, the housing 16 may be articulated at least 15° in total, at least 20° in total, at least 30° in total, at least 40° in total, at least 50° in total, or at least 60° in total equally split between the side directions. Therefore, the size of the aperture 32 in the PCB 30 (FIG. 2), the size and depth of the concave surface 34 (FIG. 3), and the size and shape of the sleeve 36 may be configured to permit the camera unit 20 to capture images uninterrupted between the articulated positions. One or more wires 38 may extend from an electrical connector 40 on the mounting member 18, through a hollow cavity of the mounting member 18, and to the camera unit 20 and other components of the mirror assembly 10A-10C.

Figure 6:
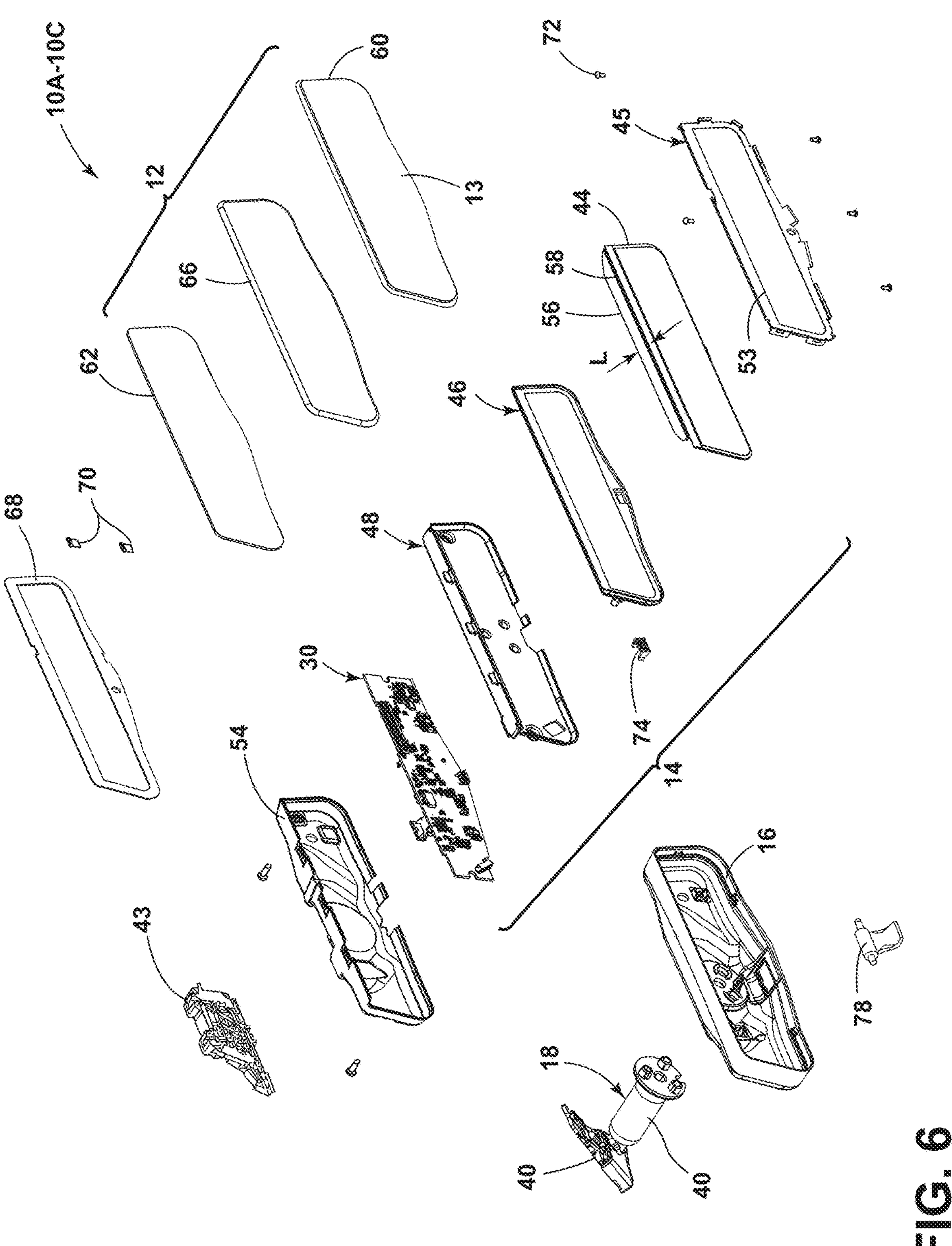
FIG. 6 is a disassembled top perspective view of the mirror assembly, according to the present disclosure.

Referring now to FIG. 6, the mirror assembly 10A-10C in a partially disassembled condition is illustrated in accordance with constructions provided in FIGS. 1-4. The mounting member 18 may extend rearward from a back surface, a top surface, or other locations of the housing 16. The mounting member 18 includes a mount plate 42 and a mounting bracket 43 that is adapted for mounting on a windshield or overhead space of a vehicle. A bezel assembly 45 may be configured to define an outer profile of the glass element 12.

The display module 14 may comprise several components, including a display 44, an optic block 46, and a heat sink 48. The PCB 30 operates to provide electrical power (e.g., from wires 38) and control for the components of the camera unit 20, the display module 14, and the glass element 12. The mirror assembly 10A-10C may include a front shield 53 and an intermediate shield 54 that shield and support the glass element 12 and the display module 14. The housing 16, the intermediate shield 54, the front shield 53, and components of the display module 14 include various retaining features to operably connect the several components of the display module 14 with the housing 16, the intermediate shield 54, front shield 53, and the bezel assembly 45 to provide support to the display module 14 and the glass element 12. More particularly, the housing 16 includes retaining features to operably connect the housing 16 to the intermediate shield 54, and the intermediate shield 54 includes retaining features to operably connect the display module 14. The bezel assembly 45 and the front shield 53 likewise have retaining features to operably connect the bezel assembly 45 and the front shield 53 to the display module 14. The retaining features generally include snap-fit connections, tab and slot connections, screw connections, and/or other known retaining features. In some embodiments, the intermediary shield 54 or other portions of the mirror assembly 10A-10C may include an ambient light sensor (not shown).

The display 44 may be a liquid crystal display (LCD), a light-emitting diode (LED), an organic light-emitting diode (OLED), plasma, digital light processing (DLP), or other display technology. The display 44 further includes a flexible electrical connector 56 which is operably mechanically and electrically connected with the PCB 30. The flexible electrical connector 56 has a length L that is sufficient to extend over and wrap around the display module components between the display 44 and the PCB 30, and has a width which extends substantially along a top edge 58 of the display 44. Ends of the flexible electrical connector 56 may be chamfered to ease manufacturing. The flexible electrical connector 56, when operably coupled to the PCB 30, aids in securing the components along a top edge 58 of the display module 14.

In the full display mirror configuration, when the glass element 12 functions as a partially reflective, partially transmissive element, the glass element 12 may include an electro-optic medium which may include a prism-type construction or an electrochromic-type construction. In the prism-type construction, the electro-optic medium may generally include one glass element 12 having a varying thickness from top to bottom. The glass element 12 includes at least two glass substrates, which may include a front substrate 60 as well as a rear substrate 62. The front substrate 60 may include a first surface and a second surface and the rear substrate 62 may include a third surface and a fourth surface. In some embodiments, the rear substrate 62 has a thickness between 2 mm and 4 mm, for example, about 3 mm that defines the concave surface 34. An electro-optic medium may be disposed between the front substrate 60 and the rear substrate 62. The viewing area 13 is defined by a first surface of the front substrate 60. The viewing area 13 may be a rectangular shape, a trapezoidal shape, or any custom-contoured shape for utilitarian and aesthetic purposes. A border of the glass element 12 may incorporate a concealing layer 66 (FIG. 1) or edge treatment, such as a chrome ring, an opaque ring, or other similar finish, to conceal a peripheral area of the housing 16, the intermediate shield 54, and other elements located behind the glass element 12. A foam adhesive 68 may be connected to an inner side of the glass element 12. A pair of J-clips 70 (or other types of conductors) may electrically couple the glass element 12 to the PCB 30. In the electrochromic-type construction, the electro-optic medium is an electrochromic medium, which includes at least one solvent, at least one anodic material, and at least one cathodic material. Typically, both of the anodic and cathodic materials are electroactive and at least one of them is electrochromic. It will be understood that regardless of its ordinary meaning, the term "electroactive" will be defined herein as a material that undergoes a modification in its oxidation state upon exposure to a particular electrical potential difference. Additionally, it will be understood that the term "electrochromic" will be defined herein, regardless of its ordinary meaning, as a material that exhibits a change in its extinction coefficient at one or more wavelengths upon exposure to a particular electrical potential difference. Electrochromic components, as described herein, include materials whose color or opacity are affected by electric current, such that when an electrical current is applied to the material, the color or opacity changes from a first phase to a second phase. During assembly, mechanical fasteners 72 may connect the components of the mirror assembly 10.

The electrochromic component as disclosed herein may be a single-layer, single-phase component, multi-layer component, or multi-phase component, as described in U.S. Pat. No. 5,928,572 entitled "Electrochromic Layer And Devices Comprising Same," 5,998,617 entitled "Electrochromic Compounds," 6,020,987 entitled "Electrochromic Medium Capable of Producing a Pre-selected Color," 6,037,471 entitled "Electrochromic Compounds," 6,141,137 entitled "Electrochromic Media for Producing a Pre-selected Color," 6,241,916 entitled "Electrochromic System," 6,193,912 entitled "Near Infrared-Absorbing Electrochromic Compounds and Devices Comprising Same," 6,249,369 entitled "Coupled Electrochromic Compounds With Photostable Dication Oxidation States," 6,137,620 entitled "Electrochromic Media With Concentration Enhanced Stability, Process for the Preparation Thereof and Use in Electrochromic Devices," and 6,519,072 entitled "Electrochromic Device"; and International Patent Application Publication Nos. WO 98/42796 entitled "Electrochromic Polymeric Solid Films, Manufacturing Electrochromic Devices Using Such Solid Films, and Processes for Making Such Solid Films and Devices," and WO 99/02621 entitled "Electrochromic Polymer System," which are herein incorporated by reference in their entireties. The glass element 12 may also be any other element having partially reflective, partially transmissive properties. To provide electric current to the glass element 12, electrical elements (e.g. a bus tape) may be provided on opposing sides of the element, to generate an electrical potential therebetween. The present disclosure may be used with a display mirror system such as that described in U.S. Pat. Nos. 9,505,349 and 10,739,591, which are hereby incorporated herein by reference in their entireties.

With continued reference to FIG. 6, a glare sensor optic 74 (FIG. 1 and FIG. 6) may be provided, in a location which receives light around or through the glass element 12 and the display 44. The glare sensor optic 74 (FIG. 1) receives light from headlamps of a trailing vehicle, and measures information regarding the likely glare visible on the glass element 12 and communicates this information to the mirror assembly 10A-10C so that the mirror assembly 10A-10C can be optimized to allow viewing of the display 44 through the glass element 12. The glare sensor optic's 74 optical vertical/horizontal pattern may be symmetrical, so that orientation of the glare sensor optic 74 is not significant (e.g., a circular geometry). The glare sensor optic 74 could also have an asymmetrical vertical/horizontal light gathering pattern, in which case a keyed feature would be put into the lens to verify correct orientation in the mirror assembly 10. The glare sensor optic 74 could also be packaged at least partially within the bezel assembly 45 of the mirror assembly 10A-10C and have a light guide which is configured to propagate light to the glare sensor optic 74. The glare sensor optic 74 could also be an imager on a rear portion of the vehicle, wherein a signal representative of the received light is communicated from the glare sensor optic 74 to the mirror assembly 10. In some embodiments, the glare sensor optic 74 may include an FDM camera and image processing by components on the PCB 30.

With reference now to FIGS. 1-6, the mirror assembly 10A-10C is considered "on axis" when a line perpendicular to the plane of the glass element 12 extends toward the eyes of a viewer. Due to the display 44 being viewed through the glass element 12, any glare on the glass element 12 may interfere with the visibility of the display 44. When the mirror assembly 10A-10C is on axis and is being used during night time driving conditions, headlights from a trailing vehicle (i.e., a vehicle driving behind the vehicle with the mirror assembly 10A-10C) as captured by the at least one image capturing device (not shown) is located in the rear of the vehicle for capturing images of other drivers or environmental conditions. According to certain embodiments of the present disclosure, an actuator device 78 is operably coupled to the mirror assembly 10A-10C. When actuated, the actuator device 78 moves at least the glass element 12 off axis (i.e., away from a direct line toward the driver's eyes) while the camera unit 20 remains stationary. Typically, actuation of the actuator device 78 tilts the glass element 12 upwards to move the viewing area 13 to an off-axis position. However, it should be appreciated that the actuator device 78 can be configured to move the glass element 12 in other directions. The actuator device 78 can also be configured to move the display 44 upon activation while the camera unit 20 remains stationary. The actuator device 78 can also be configured to turn the display 44 on or off. Thus, when the actuator device 78 is actuated to move the glass element 12 off axis, the display 44 can be turned off. Typically, when the actuator device 78 is actuated, the mirror assembly 10A-10C rotates with the glass element 12 and the display 44, keeping a constant distance relationship to each other. When the actuator device 78 is activated, the mounting member 18, camera mount 24, and mount plate 42 do not move with respect to the associated vehicle. In this manner, the glass element 12 and the display 44 may be rigidly fixed to each other and do not move independently of one another. Alternatively, the glass element 12 could be configured to move independently of the display 44. Additionally, to provide information to the viewer of the mirror assembly 10A-10C, the mirror assembly 10A-10C may include information regarding the field of view, such as a partially transmissive graphic overlay or an image on the display 44 visible on the viewing area 13 when the mirror assembly 10A-10C is in use.

The internal portion 22, camera mount 24, camera unit 20 placement and other features of the mirror assembly 10A-10C may be used in conjunction with mounting systems such as that described in U.S. Pat. Nos. 8,814,373; 8,201,800; 8,210,695; 9,174,577; 8,925,891; 8,960,629; 9,244,249; and 9,838,653, which are hereby incorporated herein by reference in their entirety. Further, the present disclosure may be used with a rearview packaging assembly such as that described in U.S. Pat. Nos. 8,814,373; 8,646,924; 8,643,931; 8,264,761; 8,885,240; and 9,316,347; and U.S. Provisional Patent Application No. 61/707,625, which are hereby incorporated herein by reference in their entirety. Additionally, it is contemplated that the present disclosure can include a bezel such as that described in U.S. Pat. Nos. 8,827,517; 8,210,695; and 8,201,800, which are hereby incorporated herein by reference in their entirety.

The invention disclosed herein is further summarized in the following paragraphs and is further characterized by combinations of any and all of the various aspects described therein.

According to one aspect of the present disclosure, a mirror assembly for a vehicle includes a glass element that is at least partially reflective and a housing that is coupled to the glass element. A mounting member includes an internal portion located within the housing that defines a mounting member connector. The housing includes a housing connector operably coupled to the mounting member connector and configured to articulate the housing relative to the mounting member between different positions. A camera unit is connected to the internal portion of the mounting member such that it remains stationary as the housing is articulated relative to the mounting member.

According to another aspect of the present disclosure, a housing is configured to articulate in pitch and yaw directions relative to a mounting member.

According to yet another aspect of the present disclosure, a housing is further configured to articulate in a roll direction relative to a mounting member.

According to still another aspect of the present disclosure, a housing connector includes a basket and a mounting member connector includes a ball.

According to another aspect of the present disclosure, a PCB is located in a housing that defines an aperture aligned with a camera unit.

According to yet another aspect of the present disclosure, a PCB is located between a glass element and a camera unit.

According to still another aspect of the present disclosure, a PCB is located between a camera unit and a mounting member connector and an internal portion extends through an aperture.

According to another aspect of the present disclosure, a PCB is located in a housing that is statically connected to an internal portion of a mounting member and remains stationary when a housing is articulated relative to a mounting member.

According to yet another aspect of the present disclosure, a sleeve extends around a camera unit to reduce ambient light from interfering with the camera unit.

According to still another aspect of the present disclosure, a sleeve extends from a camera unit into close proximity to a glass element.

According to another aspect of the present disclosure, a glass element defines a concave surface and a camera unit is at least partially located in a space defined by a concave surface.

According to another aspect of the present disclosure, a concave surface has a parabolic or spherical shape.

According to yet another aspect of the present disclosure, a concave surface has a chrome layer.

According to another aspect of the present disclosure, a mirror assembly for a vehicle includes a glass element that is at least partially reflective and a housing that is coupled to the glass element, A mounting member includes an internal portion located within the housing that defines a mounting member connector. The housing includes a housing connector operably coupled to the mounting member connector and configured to articulate the housing relative to the mounting member between different positions along at least two axes. A camera unit is connected to the internal portion of the mounting member such that it remains stationary as the housing is articulated relative to the mounting member. A printed circuit board ("PCB") is located in the housing and is statically coupled to one of the mounting members and the housing.

According to yet another aspect of the present disclosure, a glass element is partially reflective, partially transmissive and includes a front substrate defining a first surface and a second surface, a rear substrate defining a third surface and a fourth surface, and an electro-optic medium disposed between the front substrate and the rear substrate.

According to still another aspect of the present disclosure, a display module is located in a housing behind a rear substrate.

According to another aspect of the present disclosure, a PCB is configured to control features of a camera unit, a glass element, and a display module.

According to yet another aspect of the present disclosure, a mirror assembly for a vehicle includes a glass element that is at least partially reflective and a housing that is coupled to the glass element. A mounting member includes an internal portion located within the housing that defines a mounting member connector. The housing includes a housing connector operably coupled to the mounting member connector and configured to articulate the housing relative to the mounting member between different positions along at least two axes. A camera unit is connected to the internal portion of the mounting member such that it remains stationary as the housing is articulated relative to the mounting member. A printed circuit board ("PCB") is located in the housing and is statically coupled to one of the mounting member and the housing. The PCB defines an aperture aligned with the camera unit.

According to still another aspect of the present disclosure, a PCB is statically coupled to a housing and is located between a glass element and a camera unit.

According to another aspect of the present disclosure, a PCB is statically coupled to a mounting member and is located between a mounting member connector and a camera unit.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. A mirror assembly for a vehicle, the mirror assembly comprising:

a glass element that is at least partially reflective;

a housing coupled to the glass element;

a mounting member including an internal portion located within the housing defining a mounting member connector;

the housing including a housing connector operably coupled to the mounting member connector and configured to articulate the housing relative to the mounting member between different positions;

a camera unit connected to the internal portion of the mounting member and remaining stationary when the housing is articulated relative to the mounting member; and a flexible sleeve extending between the camera unit and the glass element that deforms during the articulation between the housing and the mounting member to reduce ambient light from interfering with the camera unit.

2. The mirror assembly of claim 1, wherein the housing is configured to articulate in pitch and yaw directions relative to the mounting member.

3. The mirror assembly of claim 2, wherein the housing is further configured to articulate in a roll direction relative to the mounting member.

4. The mirror assembly of claim 1, wherein the housing connector includes a basket and the mounting member connector includes a ball.

5. The mirror assembly of claim 1, further including a PCB located in the housing that defines an aperture aligned with the camera unit.

6. The mirror assembly of claim 5, wherein the PCB is located between the glass element and the camera unit.

7. The mirror assembly of claim 5, wherein the PCB is located between the camera unit and the mounting member connector and the internal portion extends through the aperture.

8. The mirror assembly of claim 1, further including a PCB located in the housing that is statically connected to the internal portion of the mounting member and remains stationary when the housing is articulated relative to the mounting member.

9. The mirror assembly of claim 1, wherein the sleeve extends around the camera unit and is formed of opaque material.

10. The mirror assembly of claim 9, wherein the sleeve extends from the camera unit and is coupled to one of the glass element or a display module located behind the glass element.

11. The mirror assembly of claim 1, wherein the glass element defines a concave surface and the camera unit is at least partially located in a space defined by the concave surface.

12. The mirror assembly of claim 11, wherein the concave surface has a parabolic or spherical shape.

13. The mirror assembly of claim 12, wherein the concave surface has a chrome layer.

14. A mirror assembly for a vehicle, the mirror assembly comprising:

a glass element that is at least partially reflective;

a housing coupled to the glass element;

a mounting member including an internal portion located within the housing defining a mounting member connector and a camera mount extending past the mounting member towards the glass element;

the housing including a housing connector operably coupled to the mounting member connector and configured to articulate the housing relative to the mounting member between different positions along at least two axes;

a camera unit connected to the camera mount such that it remains stationary as the housing is articulated relative to the mounting member;

a printed circuit board ("PCB") located in the housing and statically coupled to the mounting member between the mounting member connector and the camera mount; and a flexible sleeve extending between the camera unit and the glass element that deforms during the articulation between the housing and the mounting member to reduce ambient light from interfering with the camera unit.

15. The mirror assembly of claim 14, wherein the glass element is partially reflective, partially transmissive and includes:

a front substrate defining a first surface and a second surface;

a rear substrate defining a third surface and a fourth surface; and an electro-optic medium disposed between the front substrate and the rear substrate.

16. The mirror assembly of claim 15, further including a display module located in the housing behind the rear substrate.

17. The mirror assembly of claim 16, wherein the PCB is configured to control features of the camera unit, the glass element, and the display module.

18. A mirror assembly for a vehicle, the mirror assembly comprising:

a glass element that is at least partially reflective;

a housing coupled to the glass element;

a mounting member including an internal portion located within the housing defining a mounting member connector;

the housing including a housing connector operably coupled to the mounting member connector and configured to articulate the housing relative to the mounting member between different positions along at least two axes;

a camera unit connected to the internal portion of the mounting member such that it remains stationary as the housing is articulated relative to the mounting member; and a printed circuit board ("PCB") located in the housing between the camera unit and the glass element and statically coupled to the housing, the PCB defining an aperture aligned with the camera unit to permit the camera unit to capture data through the aperture.

19. The mirror assembly of claim 18, wherein a flexible sleeve extends between the camera unit and the glass element that deforms during the articulation between the housing and the mounting member to reduce ambient light from interfering with the camera unit.

20. The mirror assembly of claim 18, wherein the flexible sleeve extends around the camera unit and is formed of opaque material.

* * * * *